(12) United States Patent
Overs et al.

(10) Patent No.: US 7,486,130 B2
(45) Date of Patent: Feb. 3, 2009

(54) CLOCK SKEW COMPENSATION

(75) Inventors: Patrick Michael Overs, Caddington (GB); Nicholas James Horne, Cambridge (GB); Johann Ziegler, Cambridge (GB)

(73) Assignee: Ember Corporation, Boston, MA (US)

( * ) Notice: Subject to any disclaimer, the term of this patent is extended or adjusted under 35 U.S.C. 154(b) by 0 days.

(21) Appl. No.: 11/610,943

(22) Filed: Dec. 14, 2006

(65) Prior Publication Data
US 2007/0136708 A1 Jun. 14, 2007

Related U.S. Application Data

(60) Provisional application No. 60/750,915, filed on Dec. 14, 2005.

(51) Int. Cl.
*G06F 1/04* (2006.01)
(52) U.S. Cl. .................................. 327/595; 327/565
(58) Field of Classification Search ........................ None
See application file for complete search history.

(56) References Cited

U.S. PATENT DOCUMENTS 5,517,147 A * 5/1996 Burroughs et al. .......... 327/295
6,114,877 A * 9/2000 Brown et al. ................ 326/96
6,204,713 B1 * 3/2001 Adams et al. ............... 327/295
6,639,442 B1 * 10/2003 Ghameshlu et al. ......... 327/293
6,879,196 B2 * 4/2005 Lutkemeyer ................ 327/161
7,272,743 B2 * 9/2007 Oikawa ...................... 713/503
7,276,952 B2 * 10/2007 Desai et al. ................. 327/291

OTHER PUBLICATIONS

Chaturvedi, R. and J. Hu, "A Simple Yet Effective Merging Scheme for Prescribed-Skew Clock Routing." Proceedings 21st International Conference on Computer Design, Publication Date: Oct. 13-15, 2003, pp. 282-287.
Chen, Y. et al., "The Associative-Skew Clock Routing Problem." International Conference on Computer-Aided Design, 1999 (ICCAD '99), p. 168.
Pan, M. et al., "Transition Time Bounded Low-power Clock Tree Construction." IEEE International Symposium on Circuits and Systems, 2005 (ISCAS '05), vol. 3, pp. 2445-2448.
Chaturvedi, R. and J. Hu, "Buffered Clock Tree for High Quality IC Design." 5th International Symposium on Quality Electronic Design, 2004 (ISQED'04), pp. 381-386.

* cited by examiner

*Primary Examiner*—Cassandra Cox
(74) *Attorney, Agent, or Firm*—Fish & Richardson P.C.

(57) ABSTRACT

A clock distribution approach includes distributing a clock signal from a clock tree to a first set of circuit elements characterized by a first circuit characteristic; and distributing a clock signal from a sub-tree of the clock tree to a second set of circuit elements characterized by a second circuit characteristic different from the first circuit characteristic.

27 Claims, 4 Drawing Sheets

CLOCK SKEW COMPENSATION

CROSS-REFERENCE TO RELATED APPLICATIONS

This application claims priority to U.S. Provisional Application Ser. No. 60/750,915, filed on Dec. 14, 2005, incorporated herein by reference.

BACKGROUND

The invention relates to clock skew compensation.

Digital circuits (e.g., integrated circuits) include circuit elements that function according to a clock signal that is distributed throughout the circuit by a clock distribution network. In some cases, the topology of the clock distribution network is that of a tree. A clock tree has a clock source at the root of the tree and circuit elements at the leaves of the tree. The nodes of the clock tree are buffers (signal driving circuit elements) that drive some number of sinks. A sink can be a leaf circuit element or a buffer circuit element driving a sub-tree.

The structure of a clock tree can be described according to levels. Each node other than the root is connected to a "parent" node by a link in a graph representing the tree. The root of a tree is at level 0. The nodes directly connected to the root are at level 1. The nodes directly connected to nodes at level L are at level L+1. Thus, the level of a node is the number of links between the root and that node. The largest level is the depth D of the tree. Since a buffer has a limit to the number of sinks that it can drive (the "fanout" limit), an increase in the number of circuit elements driven by a clock tree, in some cases, calls for an increase in the depth of the clock tree.

The buffers in a clock tree (or other type of clock distribution network) introduce delay in the clock signal provided to a circuit element with respect to a reference clock signal (e.g., the signal at the root source node). Clock tree synthesis techniques are used to balance delay in different portions of a clock distribution network to meet setup and hold times for bistable multivibrator circuit elements such as flip-flops or latches. In some cases, this calls for reducing skew between clock signals at the inputs of circuit elements. For example, if the output of a first flip-flop is connected to the input of a second flip-flop, the rising edge of the clock supplied to the first flip-flop should be close enough to the rising edge of the clock supplied to the second-flip for the signal propagated between the flip-flops to meet the setup and hold time requirements of the second flip-flop. Balancing delays in a circuit can involve adding delay (e.g., with delay buffers) in logic paths of the circuit. In some cases, the clock distribution network is designed such that "useful skew" between clock inputs supplied to circuit elements is used to compensate for circuit delays to meet setup and hold times and improve overall system performance. Other techniques can be used to synchronize clock signals in a digital system, including using phase-locked loops to synchronize clock signals for different portions of a circuit.

SUMMARY

In one aspect, in general, the invention features an integrated circuit. The integrated circuit includes a first clock distribution network distributing a first clock signal to a first set of circuit elements and a second clock distribution network distributing a second clock signal to a second set of circuit elements. The first set of circuit elements and at least a portion of the first clock distribution network are located in a portion of the circuit characterized by a first circuit characteristic. The second set of circuit elements and at least a portion of the second clock distribution network are located in a portion of the circuit characterized by a second circuit characteristic different from the first circuit characteristic. The second clock distribution network includes a source of the second clock signal derived from a portion of the first clock distribution network located in the portion of the circuit characterized by the second circuit characteristic.

In another aspect, in general, the invention features a method including distributing a clock signal from a clock tree to a first set of circuit elements characterized by a first circuit characteristic; and distributing a clock signal from a sub-tree of the clock tree to a second set of circuit elements characterized by a second circuit characteristic different from the first circuit characteristic.

Aspects of the invention can include one or more of the following features.

The first and second circuit characteristics comprise different average clock signal delays.

The first and second circuit characteristics comprise different clock signal delay variations.

The first circuit characteristic comprises a first supply voltage source for the first set of circuit elements, and the second circuit characteristic comprises a second supply voltage source for the second set of circuit elements.

The first supply voltage source comprises a varying supply voltage source, and the second supply voltage source comprises a substantially fixed supply voltage source.

The substantially fixed supply voltage source comprises a regulated voltage source.

The varying supply voltage source comprises at least one battery.

The first clock distribution network has a tree topology.

The second clock distribution network has a tree topology.

The first and second sets of circuit elements each include at least one bistable multivibrator circuit element.

At least one bistable multivibrator circuit element in the second set provides an input signal for a bistable multivibrator circuit element in the first set.

At least one bistable multivibrator circuit element in the first set provides an input signal for a bistable multivibrator circuit element in the second set.

The input signal is derived from an output of the bistable multivibrator circuit element in the second set after propagating through one or more logic gates.

Aspects of the invention can include one or more of the following advantages.

The clock distribution approach can improve a designer's ability to balance clock trees in different voltage domains such that it is possible to meet hold times in both directions without necessarily needing to add large delays. The approach controls the relative timing of clock signals at the roots of clock trees in the different voltage domains. Only small variations then remain to be compensated, which can be accomplished by adding small delays. Paths that cross from one domain to another in both directions can be made to meet hold times.

Other features and advantages of the invention will become apparent from the following description, and from the claims.

DESCRIPTION

Figure 1:
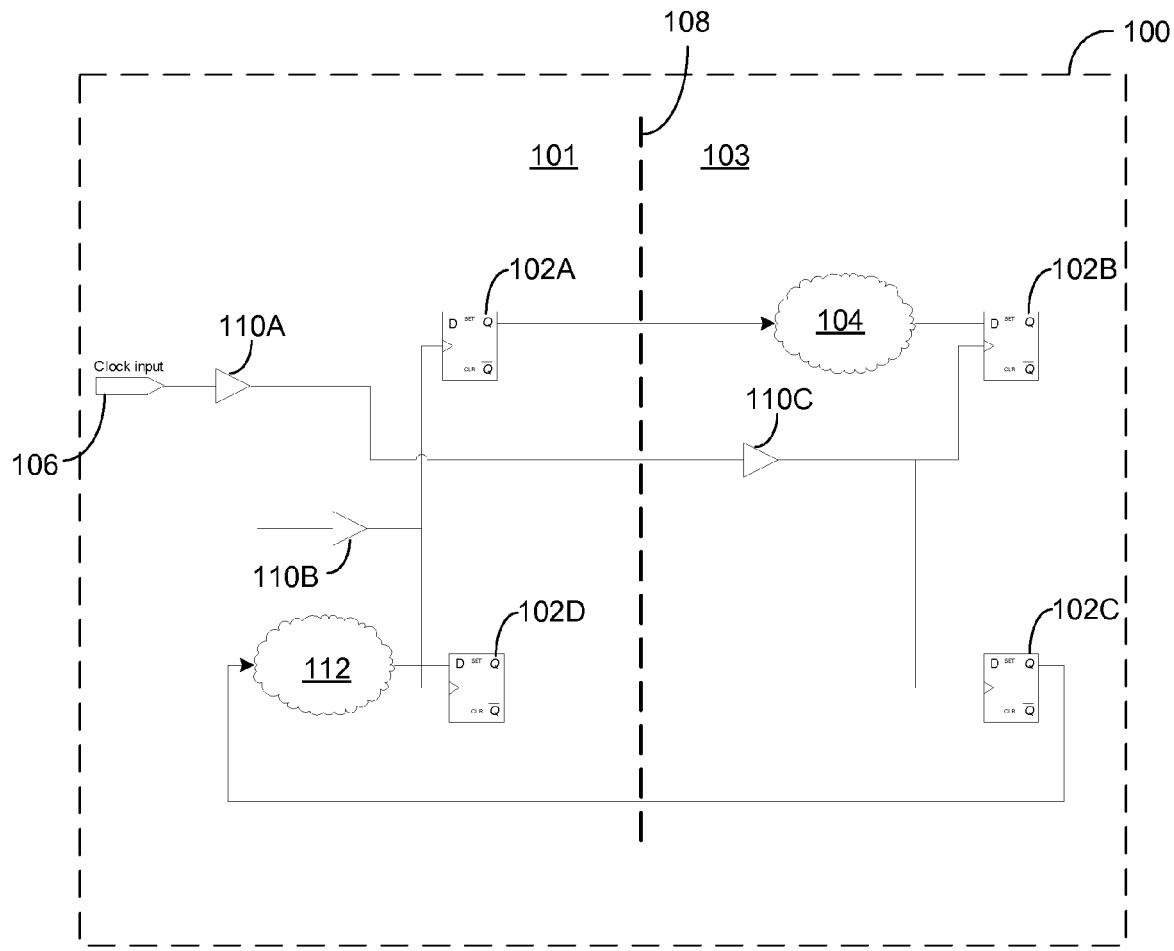
FIGS. 1, 3 and 4 are circuit diagrams.

In an integrated circuit (IC), the delays through circuit elements or logic gates can be subject to large variations due to temperature, voltage and silicon processing variations. In an integrated circuit that is fabricated from a single die, though the temperature and processing variation across the die are usually small, it is sometimes desirable to have different physical parts of the IC operating at different supply voltages. This difference in supply voltage can lead to large differences in delays between different parts of the IC.

One situation where this difference in delay can be a problem is in a system including an IC in which one circuit element has to operate over a large supply voltage range, such as a supply voltage from a battery who's output degrades over its lifetime, or from a number of different types of battery which have different output voltages. Another circuit element of the same IC may need to operate from a supply voltage that is regulated from the battery voltage and is hence fixed but may also be much lower in voltage than the battery. Such a system therefore has parts of the IC where large variations in delay are experienced and other parts where almost no variation is experienced. The differences in delay may also be greater due to the use of different types of logic libraries for the two supply voltage regimes, where the library used with large variations in supply voltage may be much slower than the library used with narrow variations in supply voltage.

In some IC designs this variation in delay can be compensated by appropriate design of the interface between parts of the IC that operate at different voltages. However, in some cases this may not be possible. One situation where the variations in delay can be a problem is where data is transferred between flip-flops in each part of the IC. In IC designs in which the voltage is the same across the whole circuit, it is possible to balance the clock distribution network delays such that transfer of data between any two flip-flops meets setup and hold times. Setup time is the time by which input data must arrive before the clock. This is met by limiting the total delay between one flip-flop's output and the next flip-flop's input. Even with large differences in clock network delay it is normally possible to meet this requirement given a fast enough base technology. Hold time is the time that data on one flip-flop's output must remain stable after a clock edge in order to be reliably captured by the next flip-flop. In an IC design in which the clock trees are fully balanced it is usually possible to meet the hold time by inserting small delays (e.g., with delay buffers) between flip-flops connected together.

In a design where the clock networks are subject to different amounts of delay it is not always possible to balance them under all conditions. While it should be possible to meet the hold time in one direction across an interface between voltage domains, it is not always possible to prevent hold time violations in both directions across the interface.

Referring to FIG. 1, a circuit 100 includes a flip-flop 102A located in a first circuit domain 101 whose output is connected through one or more logic elements 104 to the input of a flip-flop 102B located in a second circuit domain 103. A conceptual interface 108 between the first circuit domain 101 and the second circuit domain 103 represents a separation between a portion of the circuit 100 characterized by relatively small variations in clock signal delay of the first domain 101, and a portion of the circuit 100 characterized by larger and/or more variable clock signal delays of the second domain 103. A flip-flop 102C located in the second circuit domain 103 has an output connected through one or more logic elements 112 to the input of a flip-flop 102D in the first circuit domain 101.

A clock distribution network for the circuit 100 includes a clock input 106 that receives a source clock signal, and buffers 110A, 110B, and 110C that distribute the clock signal to the flip-flops 102A, 102B, 102C, and 102D. A large delay in the clock signal in the second domain 103 relative to the clock signal in the first domain 101 can lead to a violation in hold time. If this clock skew is small, flip-flop 102A transfers data to flip-flop 102B and observes the hold time at flip-flop 102B's input. If the delays in the logic elements 104 in the path between flip-flop 102A and flip-flop 102B are small and the clock skew is large then this hold time may not be met. However, for a flip-flop 102C transferring data in the opposite direction across the interface 108 to a flip-flop 102D the hold time is met in this case because of the skew between the clocks, which in this direction helps to meet the hold time. The setup time can be met by limiting the delay caused by logic elements 112 on the path between flip-flop 102C and flip-flop 102D.

Figure 2:
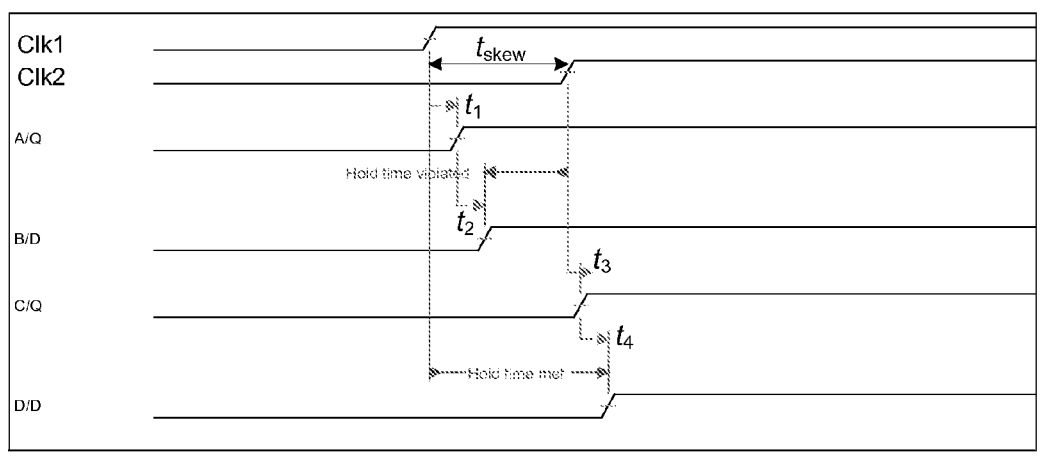
FIGS. 2, 5 and 6 are timing diagrams.

The timing diagram in FIG. 2 shows the timing of clock and data signals for exemplary clock skew delays in the clock distribution network of the circuit 100. A plot labeled Clk1 shows the clock signal provided to the flip-flops 102A and 102D in the first circuit domain 101. A plot labeled Clk2 shows the clock signal provided to the flip-flops 102B and 102C in the second circuit domain 103, where rising edge of the clock signal Clk2 is delayed with respect to the rising edge of the clock signal Clk1 by a clock skew delay $t_{skew}$. A plot labeled A/Q shows the output signal from flip-flop 102A. A plot labeled B/D shows the input signal provided to flip-flop 102B. A plot labeled C/Q shows the output signal from flip-flop 102C. A plot labeled D/D shows the input signal provided to flip-flop 102D.

In this example, the clock skew delay $t_{skew}$ is large enough such that the hold time $t_{hold}$ is not met for flip-flip 102B. The output signal A/Q transitions at a time delay $t_1$ relative to Clk1, and the input signal B/D transitions at a time delay $t_2$ relative to the A/Q transition. Since the Clk2 transition occurs at a skew delay $t_{skew}$ relative to Clk1 that is larger than $t_1+t_2-t_{hold}$, the hold time for the input signal B/D at flip-flop 102B is violated. The output signal C/Q transitions at a time delay $t_3$ relative to Clk2, and the input signal D/D transitions at a time delay $t_4$ relative to the C/Q transition. Since the flip-flop 102D is clocked by Clk1, the hold time for the input signal D/D at flip-flop 102D is met.

Figure 3:
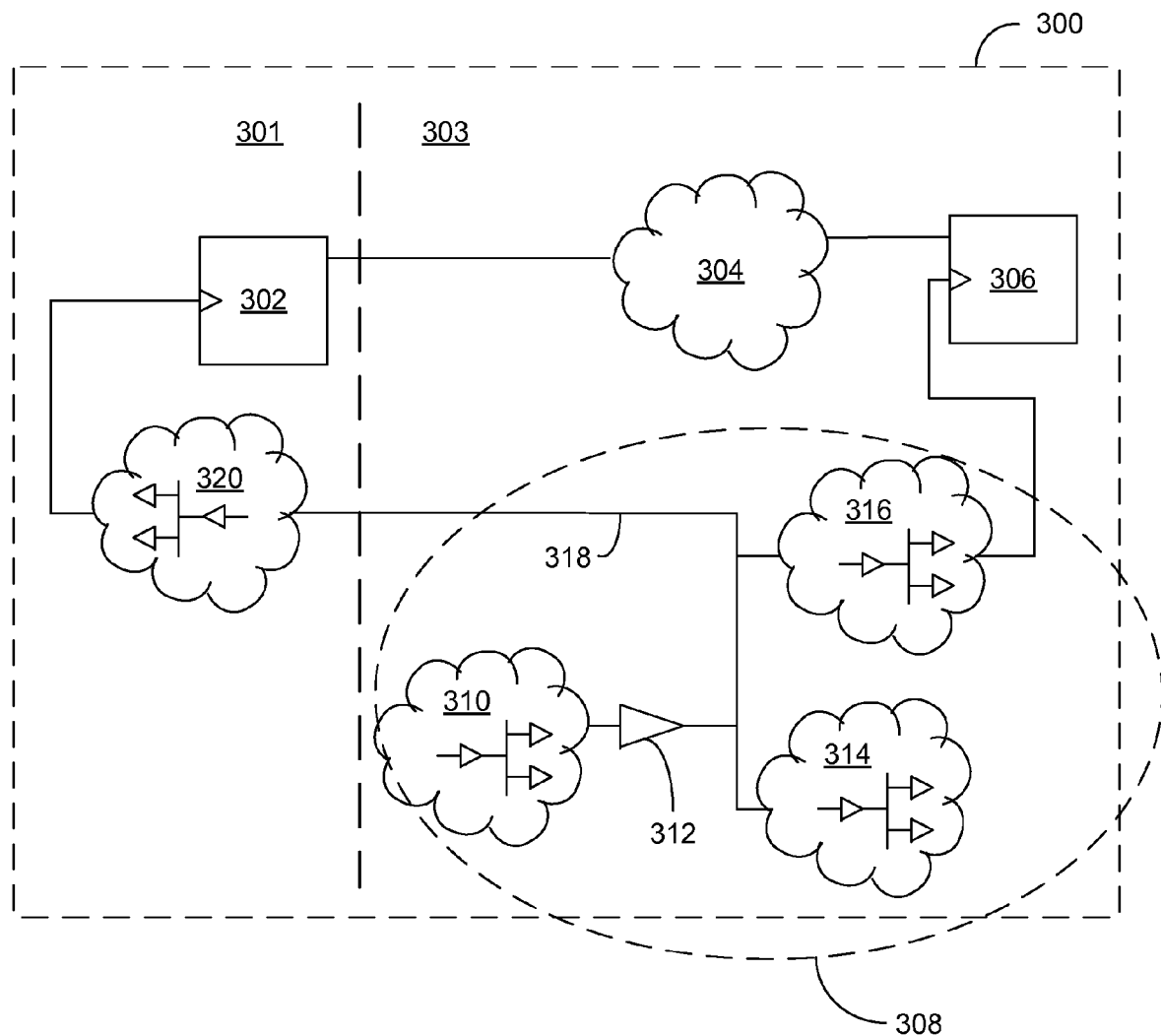

Referring to FIG. 3, a clock distribution approach used in a circuit 300 includes a first circuit element 302 located in a first circuit domain 301 characterized by relatively small variations in clock signal delay. The first circuit element 302 is connected (optionally through logic 304) to a second circuit element 306 located in a second circuit domain 303 characterized by larger and/or more variable clock signal delays. A clock tree 308 in the second domain 303 includes a first portion 310 connected to a buffer 312 feeding a first subtree 314 and a second subtree 316. A clock tree 320 in the first domain 301 has a root that is taken from a portion of the clock tree 308 in the second domain 303. By taking the root 318 of the clock tree 320 of the first domain 301 from part way along the clock tree 308 of the second domain 303, it is possible to reduce the skews under many conditions.

Figure 4:
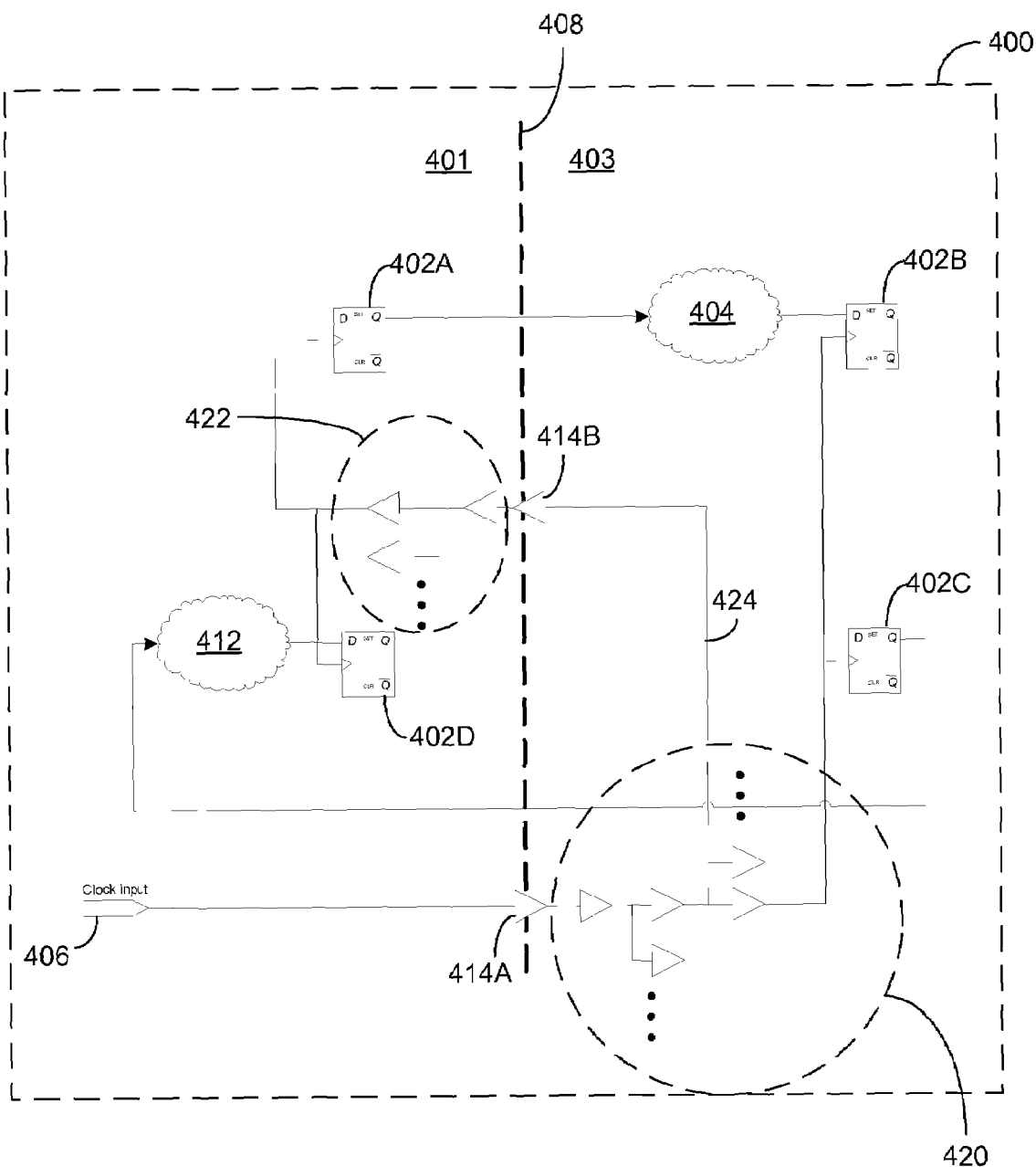

FIG. 4 shows an exemplary circuit 400 that uses this clock distribution approach. A first domain 401 uses a fixed source voltage that contributes to relatively small variations in clock signal delay. Though there may still be some variation in the clock signal delay in the first domain 401 due to changes in operating temperature, for example. A second domain 403 uses a varying source voltage that contributes to larger and more variable clock signal delays. A conceptual interface 408 separates the first circuit domain 401 and the second circuit domain 403.

The circuit 400 includes a flip-flop 402A located in the first circuit domain 101 whose output is connected through one or more logic elements 404 to the input of a flip-flop 402B located in a second circuit domain 403. A flip-flop 402C located in the second circuit domain 403 has an output connected through one or more logic elements 412 to the input of a flip-flop 402D in the first circuit domain 401.

A clock distribution network for the circuit 400 includes a clock input 406 that receives a source clock signal. In this example, the clock distribution network includes a voltage level translator 414A to translate the clock signal voltage from the first circuit domain 401 to the second circuit domain 403, and a voltage level translator 414B to translate the clock signal voltage from the second circuit domain 403 to the first circuit domain 401. A clock tree 420 distributes a clock signal from the root of the tree 420 to circuit elements in the second circuit domain 403 including the flip-flops 402B and 402C. A clock tree 422 distributes a clock signal from the root of the tree 422 to circuit elements in the first circuit domain 401 including the flip-flops 402A and 402D. The root clock signal distributed by the clock tree 422 is derived from a voltage translated clock signal taken from a portion of the clock tree 420 located in the second circuit domain 403 (e.g., taken from a level of the clock tree 420 that is below the root and above the depth of the clock tree 420).

Figure 5:

The timing diagram in FIG. 5 shows the relationship between the clocks under "small variation case" (i.e., the case in which delay variations across the IC are small) and "large variation case" (i.e., the case in which delay variations across the IC are large) conditions as well as the "average case" (i.e., the case in which delay variations are average). The plots shown in FIG. 5 show relative time positions for the rising edge of the clock signals in different portions if the circuit 400. The reference clock ClkRef corresponds to the source clock signal at the clock input 402. The pair of clock signals Clk1S and Clk2S correspond to clock signals for elements in the first and second domains, respectively, in the small variation case. The pair of clock signals Clk1L and Clk2L correspond to clock signals for elements in the first and second domains, respectively, in the large variation case. The pair of clock signals Clk1A and Clk2A that correspond to the average case represent the case of equal delay from the clock input 402 to the end points of the distributed clock networks for the first and second domains, respectively.

Although this balance of delay is not achieved under small variation case and the large variation case, the root of the clock network supplied to the first domain 401 can be taken from a selected stage of the clock network supplied to the second domain 403 so that the clock signals in the first domain are delayed by the majority of the delay experienced by the clock signals in the second domain to remove the bulk of the difference between them. This leaves only a small amount of delay difference between the clock networks that cannot be "trimmed out" in this way. This residual uncertainty can be centered about the ideal zero delay difference by careful choice of the tap point 424.

For example, in one scenario, the clock tree 420 has a delay that is determined by a delay per level of $D_v$ with n levels. The clock tree 422 is tapped after n−x levels of the clock tree 420, and the additional delay in the first domain 401 is determined by a delay per level of $D_f$ with m levels. The clock skew is then given by: $mD_f - xD_v$.

With both domains operating in the small variation case conditions the clock delays in the first and second domains are smaller (e.g., 2.5 ns per level for the variable domain and 0.5 ns per level for the fixed domain) so there is very little skew between the clocks. Because the root of the clock tree 422 is tapped off before the end points of the clock tree 420, its own end points at the leaves of the clock tree 422 are slightly earlier than those in the second domain 403. For example, if m=4 and x=1, then the skew is −0.5 ns in the small variation case.

With both domains operating in the large variation case conditions the clock delays in the second domain 403 increase (e.g., 3.5 ns per level) and the clock delays in the first domain 401 increase (e.g., 1 ns per level), so the end points at the leaves of the both clock trees are later. However because the clock tree 422 is deeper relative to the clock input than the part of the clock tree 420 after the tap point 424, the first domain clock end points are slightly later than those in the second domain 403. For example, if m=4 and x=1, then the skew is 0.5 ns in the large variation case.

With conditions that are in between these two extremes (e.g., the average) the relative clock timing will also be at some point between the two extremes. For example, if m=4 and x=1, then the skew is 0 ns in the ideal case. If hold times are met at the two extremes then they can also be met at points in between.

In the example described above, the clock in the second domain 403 actually has a smaller relative variation in delay than the variation of the clock in the first domain 401, but a larger absolute variation in delay. Similar results can be achieved if the relative variation is the same or larger.

Thus, by making the first domain's clock tree 422 a slave of the second domain's clock tree 420, it is possible to center the clocks such that over a large range of operating conditions they vary by substantially the same amount in each direction relative to each other. This centering can be done by careful choice of the tap point 424 along the clock tree 420. It is possible to choose the tap point automatically by using clock tree synthesis tools to set the nominal skew between the clock tree 420 end points and the portion of the clock tree 420 that provides the root of the clock tree 422.

Figure 6:
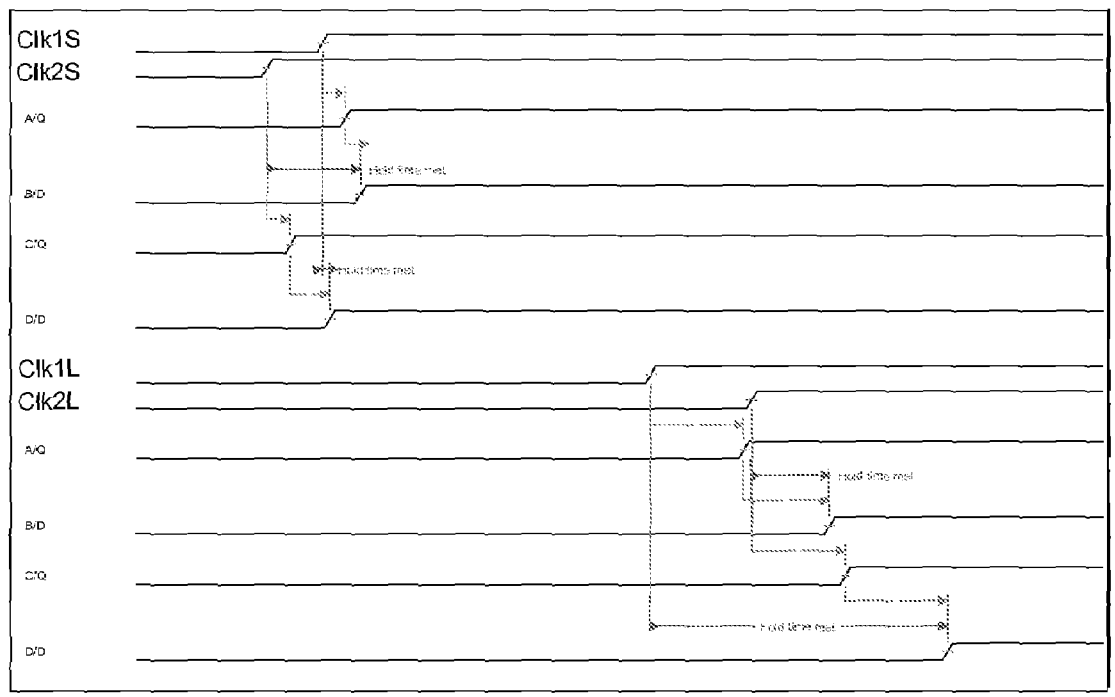

The timing diagram in FIG. 6 shows the resulting data transfer timing for the scenario described above after adding small delays by inserting buffers to fix residual hold time violations. In both cases, the amount of skew between the clock signals for the first and second circuit domains is relatively small (e.g., −0.5 ns or 0.5 ns using the delay values calculated above). For the small variation case, since the transition of the clock signal Clk2S for the flip-flop 402B is before the transition of the clock signal Clk1S for the flip-flop 402A, the hold time at flip-flop 402B is easily met. In this example, there is enough of a delay between the C/Q output of flip-flop 402C and the D/D input of flip-flop 402D that the hold time at flip-flop 402D is met, notwithstanding the clock skew delay of Clk1S relative to Clk2S. For the large variation case, the transition of the clock signal Clk2L is after the transition of the clock signal Clk1L, and there is enough of a delay between the A/Q output of flip-flop 402A and the B/D input of flip-flop 402B that the hold time at flip-flop 402B is met. In this case, the hold time at flip-flop 402D is easily met due to the relative order of Clk1L and Clk2L transitions.

It is to be understood that the foregoing description is intended to illustrate and not to limit the scope of the invention, which is defined by the scope of the appended claims. Other embodiments are within the scope of the following claims.

What is claimed is:

1. An integrated circuit, comprising:
a first clock distribution network distributing a first clock signal to a first set of circuit elements, the first set of circuit elements and at least a portion of the first clock distribution network located in a portion of the circuit characterized by a first circuit characteristic; and
a second clock distribution network distributing a second clock signal to a second set of circuit elements, the second set of circuit elements and at least a portion of the second clock distribution network located in a portion of the circuit characterized by a second circuit characteristic different from the first circuit characteristic;
wherein the second clock distribution network includes a source of the second clock signal derived from a portion of the first clock distribution network located in the portion of the circuit characterized by the second circuit characteristic; and
wherein the first circuit characteristic comprises a first supply voltage source for the first set of circuit elements, and the second circuit characteristic comprises a second supply voltage source for the second set of circuit elements; and
wherein the first supply voltage source comprises a varying supply voltage source, and the second supply voltage source comprises a substantially fixed supply voltage source.

2. The integrated circuit of claim 1, wherein the first and second circuit characteristics comprise different average clock signal delays.

3. The integrated circuit of claim 1, wherein the first and second circuit characteristics comprise different clock signal delay variations.

4. The integrated circuit of claim 1, wherein the substantially fixed supply voltage source comprises a regulated voltage source.

5. The integrated circuit of claim 1, wherein the varying supply voltage source comprises at least one battery.

6. The integrated circuit of claim 1, wherein the first clock distribution network has a tree topology.

7. The integrated circuit of claim 6, wherein the second clock distribution network has a tree topology.

8. The integrated circuit of claim 1, wherein the first and second sets of circuit elements each include at least one bistable multivibrator circuit element.

9. The integrated circuit of claim 8, wherein at least one bistable multivibrator circuit element in the second set provides an input signal for a bistable multivibrator circuit element in the first set.

10. The integrated circuit of claim 9, wherein at least one bistable multivibrator circuit element in the first set provides an input signal for a bistable multivibrator circuit element in the second set.

11. The integrated circuit of claim 9, wherein the input signal is derived from an output of the bistable multivibrator circuit element in the second set after propagating through one or more logic gates.

12. A method for distributing clock signals to circuit elements, comprising:
distributing a clock signal from a clock tree to a first set of circuit elements characterized by a first circuit characteristic; and
distributing a clock signal from a sub-tree of the clock tree to a second set of circuit elements characterized by a second circuit characteristic different from the first circuit characteristic;
wherein the first circuit characteristic comprises a first supply voltage source for the first set of circuit elements, and the second circuit characteristic comprises a second supply voltage source for the second set of circuit elements; and
wherein the first supply voltage source comprises a varying supply voltage source, and the second supply voltage source comprises a substantially fixed supply voltage source.

13. The method of claim 12, wherein the first and second circuit characteristics comprise different average clock signal delays.

14. The method of claim 12, wherein the first and second circuit characteristics comprise different clock signal delay variations.

15. The method of claim 12, wherein the substantially fixed supply voltage source comprises a regulated voltage source.

16. The method of claim 12, wherein the varying supply voltage source comprises at least one battery.

17. An integrated circuit, comprising:
a first clock distribution network distributing a first clock signal to a first set of circuit elements, the first set of circuit elements and at least a portion of the first clock distribution network located in a portion of the circuit characterized by a first circuit characteristic; and
a second clock distribution network distributing a second clock signal to a second set of circuit elements, the second set of circuit elements and at least a portion of the second clock distribution network located in a portion of the circuit characterized by a second circuit characteristic different from the first circuit characteristic;
wherein the second clock distribution network includes a source of the second clock signal derived from a portion of the first clock distribution network located in the portion of the circuit characterized by the second circuit characteristic; and
wherein the first and second sets of circuit elements each include at least one bistable multivibrator circuit element; and
wherein at least one bistable multivibrator circuit element in the second set provides an input signal for a bistable multivibrator circuit element in the first set.

18. The integrated circuit of claim 17, wherein the first and second circuit characteristics comprise different average clock signal delays.

19. The integrated circuit of claim 17, wherein the first and second circuit characteristics comprise different clock signal delay variations.

20. The integrated circuit of claim 17, wherein the first circuit characteristic comprises a first supply voltage source for the first set of circuit elements, and the second circuit characteristic comprises a second supply voltage source for the second set of circuit elements.

21. The integrated circuit of claim 20, wherein the first supply voltage source comprises a varying supply voltage source, and the second supply voltage source comprises a substantially fixed supply voltage source.

22. The integrated circuit of claim 21, wherein the substantially fixed supply voltage source comprises a regulated voltage source.

23. The integrated circuit of claim 21, wherein the varying supply voltage source comprises at least one battery.

24. The integrated circuit of claim 17, wherein the first clock distribution network has a tree topology.

25. The integrated circuit of claim 24, wherein the second clock distribution network has a tree topology.

26. The integrated circuit of claim 17, wherein at least one bistable multivibrator circuit element in the first set provides an input signal for a bistable multivibrator circuit element in the second set.

27. The integrated circuit of claim 17, wherein the input signal is derived from an output of the bistable multivibrator circuit element in the second set after propagating through one or more logic gates.

* * * * *